United States Patent
Mathew et al.

(10) Patent No.: US 7,572,723 B2
(45) Date of Patent: Aug. 11, 2009

(54) MICROPAD FOR BONDING AND A METHOD THEREFOR

(75) Inventors: Varughese Mathew, Austin, TX (US); Eddie Acosta, Martindale, TX (US); Ritwik Chatterjee, Austin, TX (US); Sam S. Garcia, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 285 days.

(21) Appl. No.: 11/552,821

(22) Filed: Oct. 25, 2006

(65) Prior Publication Data

US 2008/0099799 A1 May 1, 2008

(51) Int. Cl.
*H01L 21/4763* (2006.01)

(52) U.S. Cl. ........................ 438/597; 438/621; 438/623; 438/655; 438/664; 438/682; 257/E21.174; 257/E21.581; 257/E21.584; 257/E21.586; 257/E21.589; 257/E23.142; 257/E23.145; 257/E23.152

(58) Field of Classification Search ................. 438/676, 438/E23.039, E21.511, 597, 619, 621–623, 438/655, 664, 675, 678, 682; 257/E21.174, 257/581, 584, 586, 589, E23.013, 142, 144, 257/145, 152, 167

See application file for complete search history.

(56) References Cited

U.S. PATENT DOCUMENTS

| | | | | |
|---|---|---|---|---|
| 4,692,349 A * | 9/1987 | Georgiou et al. | ............. | 438/655 |
| 4,832,799 A * | 5/1989 | Knudsen et al. | ............. | 205/167 |
| 5,162,144 A * | 11/1992 | Brown et al. | ................ | 428/209 |
| 5,309,632 A * | 5/1994 | Takahashi et al. | ............. | 29/852 |
| 5,706,578 A | 1/1998 | Hubner | | |
| 6,245,658 B1 * | 6/2001 | Buynoski | ..................... | 438/619 |
| 6,680,128 B2 | 1/2004 | Mei | | |
| 6,720,499 B2 | 4/2004 | Bokisa et al. | | |
| 6,811,658 B2 * | 11/2004 | Hongo et al. | ............... | 204/198 |
| 6,924,232 B2 | 8/2005 | Mathew et al. | | |
| 7,049,234 B2 * | 5/2006 | Cheng et al. | ................ | 438/687 |
| 7,078,272 B2 | 7/2006 | Ho et al. | | |
| 7,317,253 B2 * | 1/2008 | Nogami | ...................... | 257/758 |
| 7,320,935 B2 * | 1/2008 | Leu et al. | .................... | 438/636 |
| 7,332,764 B2 * | 2/2008 | Choi et al. | .................. | 257/300 |
| 2003/0140988 A1 * | 7/2003 | Gandikota et al. | .......... | 148/527 |

(Continued)

OTHER PUBLICATIONS

Kostner et al; "New Flip-Chip On Chip Process Supercedes Embedded Technologies"; 14th European Microelectronics and Packaging Conference & Exhibition, Germany 2003.

(Continued)

*Primary Examiner*—Michael S Lebentritt
(74) *Attorney, Agent, or Firm*—James L. Clingan, Jr.; Susan C. Hill

(57) ABSTRACT

A semiconductor process is taught for performing electroless plating of copper overlying at least a portion of a layer comprising cobalt, nickel, or both cobalt and nickel. The cobalt and/or nickel comprising layer may be formed using electroless plating. For some embodiments, a tin layer is then formed overlying the copper. The tin layer may be formed using immersion plating or electroless plating. A micropad may comprise the cobalt and/or nickel comprising layer and the copper layer. In some embodiments, the micropad may also comprise the tin layer. In one embodiment, the micropad may be compressed at an elevated temperature to form a copper tin intermetallic compound which provides an interconnect between a plurality of semiconductor devices.

18 Claims, 3 Drawing Sheets

U.S. PATENT DOCUMENTS

2004/0245630 A1* 12/2004 Huang et al. ............... 257/737
2007/0298605 A1* 12/2007 Andryushchenko et al. . 438/626

OTHER PUBLICATIONS

Huebner et al; "Face-to-Face Chip Integration with Full Metal Interface"; Conference Proceedings ULSI XVIII, 2003 Materials Research Society, pp. 53-58.

Mathew et al; "Selective Formation of Micropads for 3D Interconnect Applications"; 212th ECS Meeting, Washington DC, Oct. 2007, pp. 305-312.

Kostner et al; "New Flip-Chip on Chip Process Supercedes Embedded Technologies" 14th European Microelectronics and Packaging Conference & Exhibition, Germany, Jun. 2003.

* cited by examiner

MICROPAD FOR BONDING AND A METHOD THEREFOR

FIELD OF THE INVENTION

The present invention relates generally to integrated circuits, and more particularly, to forming a micropad useful for die to die bonding.

BACKGROUND OF THE INVENTION

Stacking of integrated circuits has long been an available technique for increasing functionality for a given amount of space. For example, this has been a technique for doubling the amount of memory by stacking two memory integrated circuits. It has now become more desirable to use stacked integrated circuits that are of a different type because of the different manufacturing techniques used for the different functions. For example, rf circuits are often needed to be used in conjunction with logic circuits but the manufacturing techniques are quite different for these different functions. Thus, it is more practical to stack these two functions than try to achieve them both on the same integrated circuit. In stacking die, issues arise relating to the interconnection between different die or between die and a wafer that are not present with regard to a single die. A pad often called a micropad is useful in performing the die to die or die to wafer connection. Thermocompression bonding of micropads from two different die or wafers provide both mechanical and electrical inter-strata connections of the stacked die. Some of the difficulties associated with micropads relate to the processing which typically includes electroplating. One problem is undercutting of the pads and another is oxidation of the metals, e.g., copper/tin (Cu/Sn) that are commonly used.

Therefore, there is a need for an improvement in interconnect pads.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a semiconductor device has a top metal that is connected to another semiconductor device, such as another wafer, through a micropad that is connected to a contact area of a last metal layer of the semiconductor device. The micropad has a barrier layer on the contact area and copper on the barrier. The micropad may also include tin on the copper. When two micropads are connected, at least one will normally include tin or some similar metal. A passivation layer overlying the contact area is opened to expose the contact area using a masking layer. An electroless plating process is used to plate the contact area with the barrier. Another electroless plating process is used to plate the barrier with copper. The mask is kept in place so the copper can complete the micropad. The tin may then be formed over the copper by immersion plating for the pads to complete the pads needing the tin. In practice, the tin displaces a top portion of the copper so the size of the micropad with tin is very nearly the same size as the micropad before the tin is formed. The same masking layer is used from the step of exposing the contact area to the step of forming the tin. This is better understood by reference to the drawings and the following description.

Figure 1:
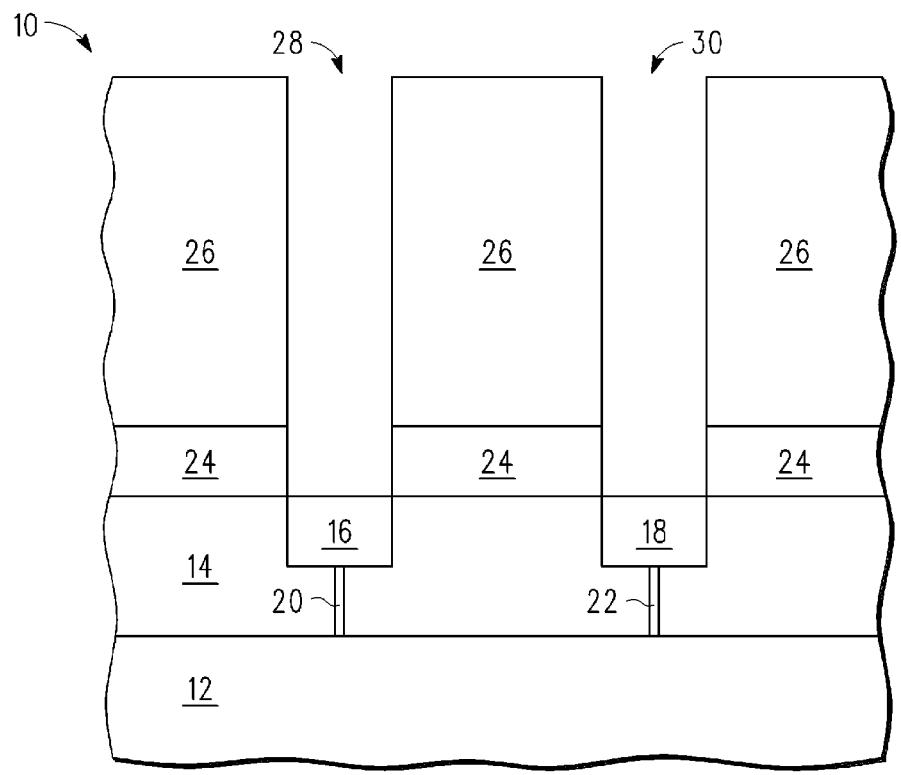
FIG. 1 is a cross section of a portion of a semiconductor device at a step in a method of an embodiment.

Shown in FIG. 1 is a semiconductor device 10 comprising a substrate and active circuitry region 12, a last insulating layer 14 over a substrate and active circuitry region 12, a contact area 16 in insulating layer 14 having a top surface substantially coplanar with top insulating layer 14, a contact area 18 in top insulating layer 14 and having a top surface substantially coplanar with top insulating layer 14; a via 20 through last insulating layer 14 connecting contact 16 to substrate and active circuitry 12, a via 22 through last insulating layer 14 connecting contact 18 to substrate and active circuitry 12, a passivation layer 24 over last insulating layer 14, a masking layer 26 over passivation layer 24, an opening 28 through masking layer 26 and passivation layer 24 to expose contact area 16, and an opening 30 through masking layer 26 and passivation layer 24 to expose contact area 18. Masking layer 26 is used as a mask in etching passivation layer 24 to form openings 28 and 30 to expose contact areas 16 and 18, respectively. Substrate and active circuitry 12 includes a substrate useful for providing physical support and making transistors and the transistors themselves and intrachip interconnect for connecting the transistors. Other electrical components may be included as well. Last insulating layer 14 may comprise multiple layers that are part of the semiconductor manufacturing process. Passivation layer 24 may be nitride, which at this stage is primarily for protecting the integrated circuit, especially the contact areas before they are exposed. Masking layer 26 is preferably photoresist but could be another masking material. Contact areas are preferably copper, which is the common metal used as the last metal of the integrated circuit for making contact outside the integrated circuit. Aluminum is another example of a metal that can be used. Semiconductor device 10 in this example is an integrated circuit that is part of a bigger wafer having a portion shown in FIG. 1. As an exemplary dimension, contact areas 16 and 18 are about 40 microns on a side. This contact area dimension will likely reduce as processes continue to improve. In this example, semiconductor device 10 has been singulated as a die from a wafer.

Figure 2:
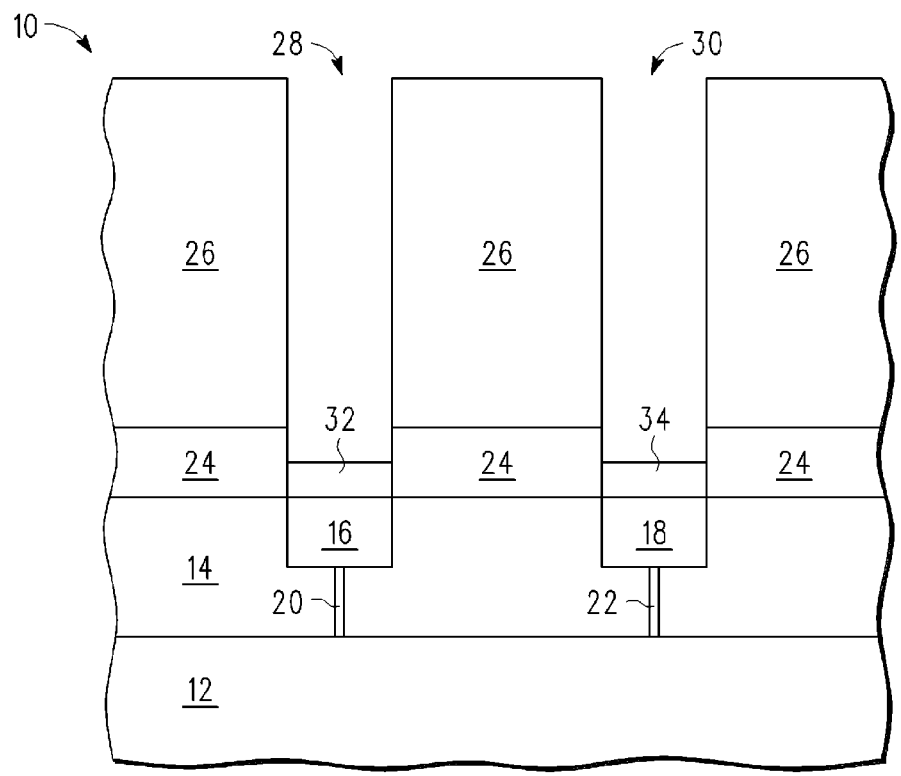
FIG. 2 is a cross section of the portion of the semiconductor device of FIG. 1 at a subsequent step in the method.

Shown in FIG. 2 is semiconductor device after cleaning contact areas 16 and 18 and then performing an electroless plating step to form a barrier layer 32 directly on contact area 16 and a barrier layer 34 on contact area 18. Barrier layers 32 and 34, as an example, may be about 0.2 microns thick. Barriers 32 and 34 are formed with masking layer 26 still present.

The barrier film is selectively formed on the semiconductor device over the metal locations, contact areas 16 and 18 in this example, using a process such as electroless plating. The electroless plating bath includes one or more of each of the following substances: a source of metal, a chelating agent, a reducing agent, a pH adjusting agent, and a surfactant and/or wetting agent. The electroless solution may also include one or more stabilizers, buffers, or other materials known in the art.

A metal carrying substance is dissolved in a solvent to provide a metal solution.

Specifically in this example, a cobalt carrying substance is dissolved in a purified solvent such as deionized water to form a cobalt metal solution. The cobalt carrying substance provides the cobalt for barrier layers 32 and 34, which are cobalt/tungsten/boron (CoWB) in this example and which are formed over contact areas 16 and 18. Exemplary cobalt carrying substances include cobalt salts such as cobalt sulfate $CoSO_4.7H_2O$ or cobalt chloride $CoCl_2.6H_2O$. In one embodiment, the cobalt-containing compound comprises cobalt sulfate hepta hydrate and is approximately 27 to 35 grams per liter of compound.

Cobalt-containing substances generally have good adhesion to copper and low resistance, but other materials may be used, for example, if selective formation of the resulting barrier material is still attainable with such materials. For example, nickel alloys, or even a nickel-cobalt alloy, may be used in place of cobalt alloys alone. Each substitute element may by used as the sole substitute or in combination with cobalt, or in combination with other respective substitutes.

After the cobalt salt is dissolved, a chelating agent is added to the solution. Chelating agents help bind the cobalt metal, for example, in solution until it is needed for plating. The binding function facilitates a more robust manufacturing process. In one embodiment, a first chelating agent is added to the solution and a second chelating agent is added. The use of two chelating agents provides certain heretofore unrealized advantages in some embodiments. For example, a plating bath may be created which includes a mixture of chelating agents in which the stability constant of one chelating agent is higher than another of the chelating agents. A first chelating agent provides the above described binding function of the metal source solution, while the second chelating agent with a different stability constant is available for the removal of any dissolved interconnect metal such as copper and any other inhibitors which may be present on the surface. This prevents accumulation of free copper ions and co-deposition with the barrier film. Thus, for example, a chelating agent is added which complexes or chelates well with the metal source to help hold the metal in solution. Also, a second chelating agent is added which complexes or chelates well with the metal which was electroplated.

For further example, a citrate compound may be added to more strongly chelate with cobalt than with other elements. Exemplary citrate compounds include sodium citrate or citric acid. Exemplary concentrations include approximately 27 to 35 grams per liter of tri-sodium citrate compound or approximately 25 to 30 grams per liter of citric acid. Sodium can have some undesirable end effects, but in controlled amounts, it provides the advantage in increased solubility. Also, malic acid may be added to more strongly chelate with any copper which reaches solution than with the cobalt in the solution. An exemplary concentration of malic acid is approximately 27 to 35 grams per liter of compound. Some exemplary chelating agents which may be used in place of or in combination with malic acid include tartrate compounds, glycine and oxalic acid.

After the chelating agent(s) are added, a pH adjusting agent is added to the solution. In one embodiment, a pH level of approximately 9, or even more specifically 9.6, is preferable, but a range of pH levels is allowable in many cases, typically above 8, and in any case, alkaline. One exemplary range of pH is approximately 8.5 to 10 or even to 11. Another predetermined acceptable range of pH levels includes pH levels from approximately 9.0 through 10.0.

In one embodiment, a first pH adjuster is added to the solution and a second pH adjuster is added. The use of two pH adjusters provides certain advantages in some embodiments such as increased stability and buffering effect which tends to resist changes in pH level. One example of such a first pH adjuster is tetramethyl ammonium hydroxide (TMAH) which may, for further example, be added to be approximately 1.0 percent to 1.5 percent of solution. Also, a second pH adjuster is added to further adjust the pH of the solution. One example of such a second pH adjuster is potassium hydroxide (KOH) which may be added in an amount required to bring the pH of the composition to a predetermined pH. The TMAH, the KOH and/or other pH adjusters may be premixed prior to adding to the solution and added in a single step. Ammonia may be used in place of TMAH and KOH.

After the pH of the solution is adjusted, a diffusion barrier material source is added to the solution. In one embodiment, a tungsten source is added to the solution. One exemplary tungsten source is sodium tungstate dihydrate ($Na_2WO_4.2H_2O$) which may be added to approximately 8 to 12 grams per liter of compound. Another is tungstic acid which may be added to approximately 6 to 5 grams per liter of compound. Other materials or elements may be used in place of tungsten. For example, molybdenum may be used to provide an additional diffusion barrier effect. Other chromium group elements can also be used as substitutes for tungsten. In other embodiments, rhenium or other manganese group elements may be used. Other substitutes for tungsten include refractory metals such as Niobium and Tantalum. In another embodiment, zirconium may be used as a substitute for tungsten. Other members of the groups of the above elements may be used, and each substitute element may by used as the sole substitute or in combination with tungsten, or in combination with other respective substitutes.

After the diffusion barrier element is added, one or more surfactants are added to the solution. The surfactants are added to aid the occurrence of uniform plating and to chemically stabilize the electroless plating bath. These surfactants may be added to approximately 20 to 100 parts per million (ppm) of compound. One such surfactant is an alkoxylated amine (e.g., alkoxylated diamine) commercially available from BASF under the registered trademark of Tetronic®. Another such surfactant is a polyglycol (e.g., polyoxypropylene-polyoxyethelene block copolymer) commercially available from BASF under the registered trademark of Pluronic®.

In one embodiment, a fluorosurfactant is added to the solution. One such surfactant is fluoroalkyl alcohol substituted monoether with polyethylene glycol commercially available from DuPont under the registered trademark of Zonyl®. The fluorosurfactant may be used alone or in combination with other surfactants. The fluorosurfactant may be added to approximately 15 to 40 parts per million (ppm) of compound.

After the surfactant(s) are added, a boron source is added. The boron source is used as a reducing agent. A reducing agent is a source of electrons for the plating step, and allows the plating step to be electroless. One such boron source is dimethyl aminoborane (DMAB). Another such boron source is a borane-morpholine complex (sometimes referred to as morpholine borane) which may be added to approximately 5 to 8 grams per liter of compound. Morpholine borane provides high solution stability at higher temperatures, and allows plating to occur at lower temperatures.

After the boron source is added, the temperature of the solution is adjusted to a value that does not degrade plating bath stability. For example, the solution may be heated to a plating temperature of 55° C., or to a temperature within the range from 50° C. to 55° C., or even to 60° C. Other temperatures may be used. Preferably, the temperature will not go below a minimum value below which plating cannot occur and will not go above a maximum value above which stability of the solution degrades unacceptably. Higher temperatures allow better plating rates, but must be balanced in view of maintaining solution stability. Higher temperature plating may require that solutions be replaced more often than otherwise would be required.

After the electroless plating bath is prepared, the semiconductor device 10 of FIG. 1 is processed in the electroless plating bath solution to plate the diffusion barrier film 32 and 34. This can be performed, by for example, flowing the solution at elevated temperatures in contact with the semiconductor device. The semiconductor device 10 may also be plated by holding the device (e.g., stationary, relatively or absolutely, or otherwise in known position(s)), and spraying the device and/or its environs, or pumping electroless plating solution or otherwise raising the level of the electroless plating solution to immerse the semiconductor device 10. The semiconductor device may be spun to enhance the plating effect.

The diffusion barrier film 32 and 34 may be comprised of a combination of conductive and diffusion barrier materials. In one embodiment, the barrier film includes a low resistive transition metal to support the placement of diffusion barrier elements.

In the presently discussed embodiment, the barrier material includes cobalt (Co), tungsten (W) and boron (B) to provide a CoWB barrier. The percentage of each element present in the barrier material may be managed so that the overall barrier material exhibits sufficient diffusion blocking but does not unduly affect the electrical characteristics of the integrated circuit. For example, for CoWB each of the cobalt, tungsten, and boron, provides some diffusion barrier effects, but decreasing the amounts of tungsten and boron below a certain amount will allow an unacceptable amount of metal diffusion through the cobalt. The boron is not necessary, but the presence of boron in the barrier film enhances the barrier efficiency, thereby potentially eliminating the need for an increased amount of the tungsten. Accordingly, more tungsten and boron in the barrier material results in a greater diffusion barrier effect being exhibited by the barrier material. In contrast, a greater percentage amount of cobalt (and therefore less tungsten and boron) results in greater conductivity being exhibited by the barrier material with less diffusion blocking.

In one embodiment, the barrier material includes 80% cobalt, 17% tungsten and 3% boron. In one embodiment, the percentage of tungsten is 16%. In other embodiments, the tungsten percentage varies from 10% to 17% or even from 9% to 22%. In another embodiment, the percentage of boron is 2%. In other embodiments, the percentage of cobalt varies from 80% to 85% or from 75% to 85% or even to 88%. Percentages of cobalt, tungsten and boron outside the above specified ranges may be used with the understanding that lower concentrations of tungsten and boron lowers the barrier effect of the barrier material, while higher concentrations of the tungsten and boron (with consequent lower concentrations of cobalt) may have undesirable electrical effects such as an unacceptable or otherwise degrading increase in resistance of the barrier layer.

After the diffusion barrier film 32 and 34 is plated, semiconductor device 10 is removed from the plating bath. Semiconductor device 10 may then be rinsed and dried.

The above described embodiment of plating barrier layer 32 and 34 sometimes employs the use of sodium-based compounds. In such an embodiment, the solution would include compounds such as cobalt sulfate, sodium citrate, malic acid, TMAH, KOH, sodium tungstate along with various surfactants. However, sometimes it is useful to have a sodium free solution. Such a sodium free bath could include compounds such as cobalt sulfate, citric acid, malic acid, TMAH, tungstic acid along with various surfactants.

Figure 3:
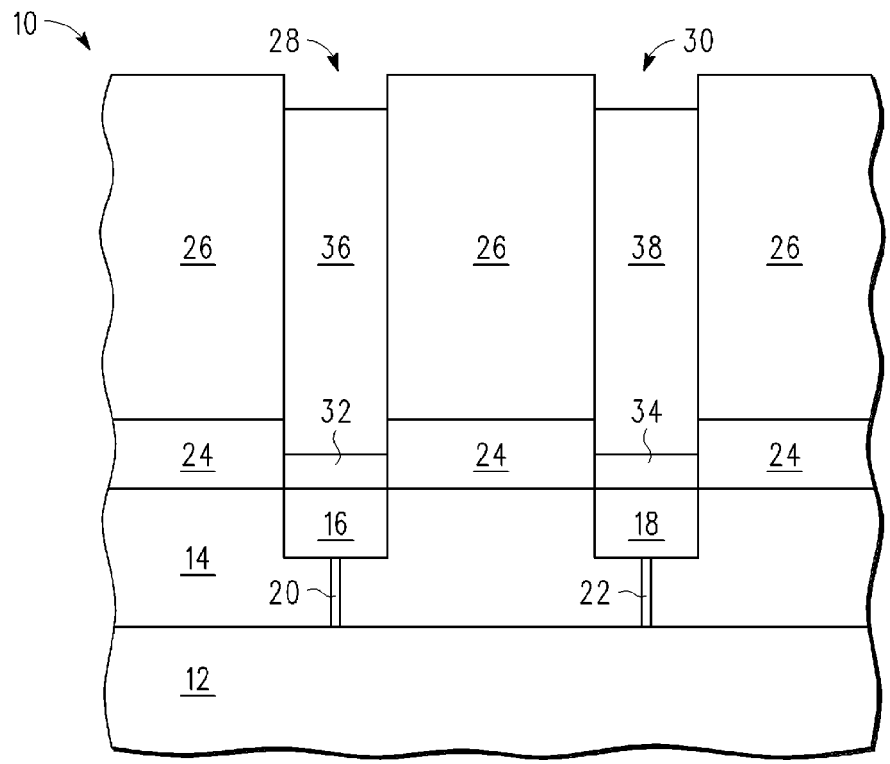
FIG. 3 is a cross section of the portion of the semiconductor device of FIG. 2 at a subsequent step in the method.

Shown in FIG. 3 semiconductor device 10 after forming copper layers 36 and 38 on barrier layers 32 and 34, respectively. Copper layers 36 and 38 are formed by an electroless plating process. The plating is achieved in a manner that has some similarities to the process for forming barrier layers 32 and 34. In this case of plating copper several different bath solutions may be used. One example is the CIRCUPOSIT™ 3350 bath of Rhom and Haas. Another example is the electroless copper deposition bath ECu57™ bath of Enthone. The temperature used is preferably about 70 degrees Celsius but other temperatures may be effective such as temperatures in the range of 50-95 degrees Celsius. A cleaning step comprising 0.1% citric acid in deionized water for 30 seconds preferably precedes the electroless plating step. The cleaning step may not be essential in all cases. The electroless plating step includes submerging semiconductor device 10 of FIG. 2 in one of the baths described above. Plating of copper layers 36 and 38 can be carried out by similar techniques such as immersion, spray or other methods as described for plating of barrier 32 and 34. The time is determined based on the deposition rate and the thickness desired. A typical rate is about 500-1000 Angstroms per minute, but other rates may be achieved. Exemplary thicknesses of copper layers 36 and 38 are from 2 to 10 microns.

Barrier layers 32 and 34 were chosen to preferably comprise cobalt, tungsten, and boron because it is a material that can formed by electroless plating and a material on which copper can be plated electrolessly. It may be beneficial to add phosphorus or change the boron to phosphorus. Similarly, another possibility is to substitute molybdenum and/or rhenium for tungsten. Also the cobalt may be replaced with nickel.

Figure 4:
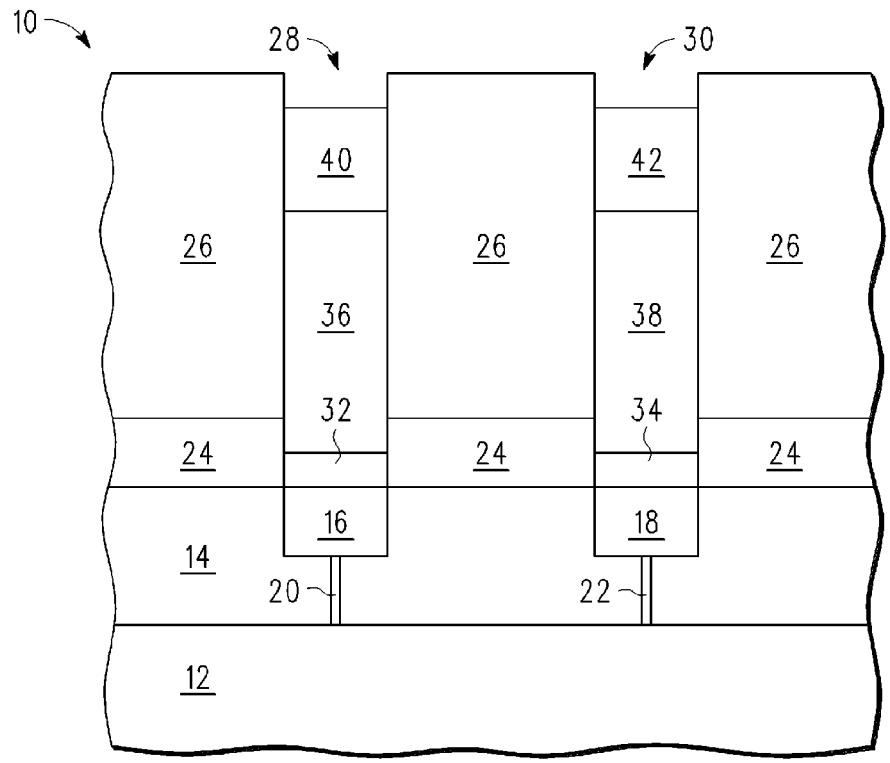
FIG. 4 is a cross section of the portion of the semiconductor device of FIG. 3 at a subsequent step in the method.

Shown in FIG. 4 is semiconductor device 10 after performing a tin immersion plating step with masking layer 26 still present that results in a top portion of copper layers 36 and 38 being converted to tin layers 40 and 42. The immersion plating step is a known technique for providing a tin-on-copper interface. One example for commercially available immersion plating tin bath is the Stannostar gem plus™ bath of Enthone. Another example is Tinposit™ bath of Rhom and Haas. The temperature used is 45-95 degrees Celsius preferably about 70 degrees. The process has the effect of tin replacing the copper. This type of effect is known as displacement because the formation of one material is achieved simultaneously by removing the starting material. Another effect is that tin layer 40 may also have some copper present because the replacement process leaves some copper in the displaced areas or by diffusion of copper to tin. Temperature and process conditions are preferably selected to form tin with minimum copper. The thickness of tin layers 40 and 42 can be determined by knowing the displacement rate and setting the time. Exemplary thicknesses are from 0.5 to 5 microns. When contact is made between two micropads, generally only one needs to have a tin layer so the formation of tin layers 40 and 42 may not be required if the micropads to which they will connect have the tin. As an alternative, tin layer 40 and 42 may be formed by an electroless plating technique.

Figure 5:
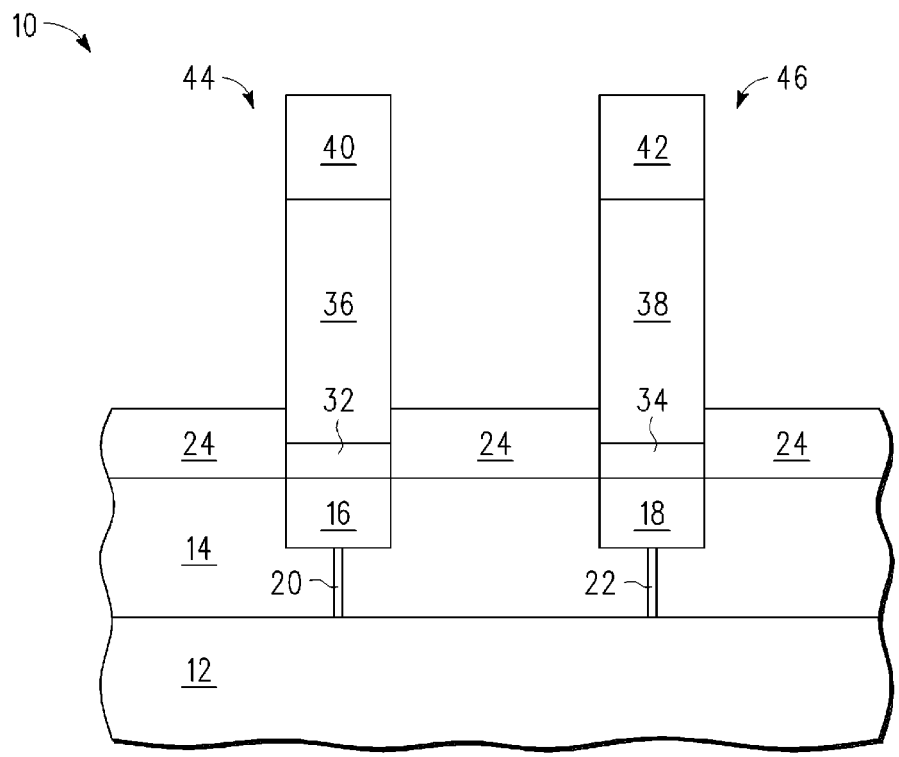
FIG. 5 is a cross section of the portion of the semiconductor device of FIG. 4 at a subsequent step in the method.

Shown in FIG. 5 is semiconductor device 10 after removal of masking layer 26. The result is finished micropads 44 and 46. Micropad, as used herein, means a conductive structure attached to a semiconductor device that is useful for making electrical contact from outside the semiconductor device to the semiconductor device. Micropad 44 comprises barrier 32, copper layer 36, and tin layer 40. Micropad 46 comprises barrier 34, copper layer 38, and tin layer 42. If micropads 44 and 46 are to interface with micropads that have a tin top layer, then it would probably be better to not form tin layers 40 and 42. Masking layer 26, as an alternative, can be removed prior to the tin immersion process. The result in such case is that tin would be formed all around the copper layer not just from the top. In this case, however, the tin on the sidewalls would not play a role in the bonding, which may not be a desired process.

Micropads 44 and 46 are thus formed without conductive material being applied over passivation layer 24 avoiding an etch to remove that material that would also attack (undercut) the sides of the micropads reducing the size of the micropads. Further the etch chemistries used for that type of removal can cause oxidation to occur on the micropads. Although such oxidation is thin, it can adversely increase resistance and reduce subsequent micropad to micropad bond strength.

Figure 6:
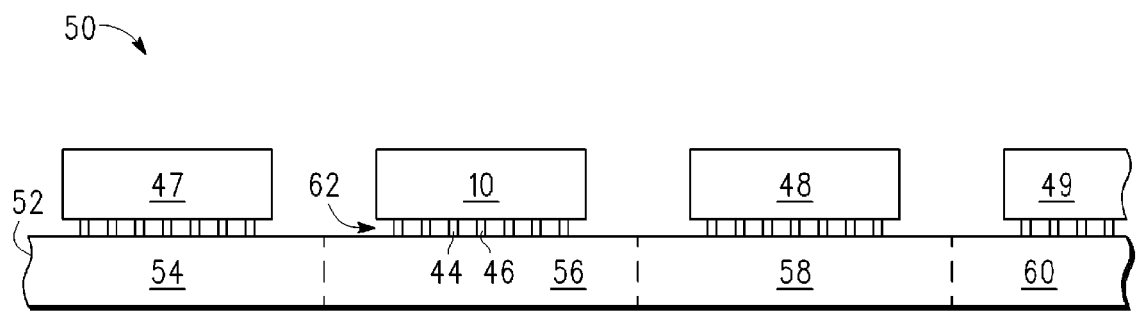
FIG. 6 is a cross section of the semiconductor device of FIG. 5 mounted on a wafer.

Shown in FIG. 6 is a three dimensionally (3-D) stacked chip module 50 comprising a wafer 52 having integrated circuits 54, 56, 58, and 60; integrated circuits 47, 48, and 49; and semiconductor device 10. Integrated circuits 47, 48, and 49 are singulated from a wafer or wafers prior to bonding to wafer 52. Integrated circuit 47 is connected to integrated circuit 54. Integrated circuit 48 is connected to integrated circuit 58. Integrated circuit 49 is connected to integrated circuit 60. Integrated circuits 47-49 and semiconductor device 10 are the same but are different from integrated circuits 54, 56, 58, and 60. In this example, semiconductor device 10 is connected to integrated circuit 56 by plurality of micropads 62 which include micropads 44 and 46. Micropads 44 and 46 have tin layers but the micropads of integrated circuit 56 may not have the tin layer. The contact between semiconductor device 10 and integrated circuit 56 is achieved by heat and pressure. Semiconductor device 10 is placed on integrated circuit 56 such that the micropads of semiconductor device 10 are resting on the micropads of integrated circuit 56 and held in place by an adhesive that is evaporated away during subsequent processing. Application of heat and pressure, a process known in the art, causes the micropads to form copper/tin compounds that have a significantly higher melting temperature than tin alone and have sufficient mechanical strength to hold the integrated circuits together during subsequent processes. Exemplary intermetallic compounds are $Cu_3Sn$ and $Cu_6Sn_5$. Thus 3-D stacked chip module 50 can withstand the addition of other die without concern of remelting the contact between previously joined integrated circuits.

Various other changes and modifications to the embodiments herein chosen for purposes of illustration will readily occur to those skilled in the art. For example, certain materials for the barriers were described, but other materials may also be effective. Further additional intervening layers may be able to be provided while still benefiting from the explained embodiments. Examples were described to aid in understanding. Thus, it was not intended that these examples were the only examples. To the extent that such modifications and variations do not depart from the spirit of the invention, they are intended to be included within the scope thereof which is assessed only by a fair interpretation of the following claims.

The invention claimed is:

1. A method of making a micropad over a top surface of a substrate and active circuitry, comprising:
    forming a structure characterized by a contact at the top surface, a photoresist layer over the top surface, and an opening in the photoresist layer over the contact;
    electrolessly plating a barrier layer comprising cobalt on the contact with the photoresist layer present;
    performing electroless plating to form a copper layer on the barrier layer with the photoresist layer present;
    removing the photoresist layer; and
    performing electroless plating of tin on the copper layer prior to removing the photoresist layer.

2. The method of claim 1, wherein the barrier layer comprises a thickness greater than or equal to 40 nanometers.

3. The method of claim 1, wherein the step of electrolessly plating comprises using a plating bath comprising a cobalt-containing substance, a fluorosurfactant, a diffusion barrier material source, and a boron source.

4. The method of claim 3, wherein the plating bath further comprises a chelating agent.

5. The method of claim 1, wherein the step of electrolessly plating comprises forming a bath comprising boron, cobalt, and tungsten and submerging the substrate and active circuitry in the bath.

6. The method of claim 1, further comprising:
    plating tin onto at least a portion of the copper layer to form a tin layer; and coupling the tin layer to an integrated circuit.

7. The method of claim 6, wherein the step of plating tin comprises:
    performing immersion plating.

8. The method of claim 6, wherein the step of plating tin comprises:
    using a plating solution at a temperature in a range of 45 to 95 degrees centigrade.

9. The method of claim 6, wherein the copper layer comprises a thickness in a range of 2 to 10 microns, and wherein the tin layer comprises a thickness in a range of 0.5 to 5 microns.

10. The method of claim 6, wherein a first micropad on a die comprises a first portion of the copper layer and a first portion of the tin layer.

11. The method of claim 10, further comprising:
    providing a wafer having a second micropad, wherein the second micropad comprises a copper portion.

12. The method of claim 11, further comprising:
    compressing together the first and second micropads at a temperature in a range of approximately 200 to 350 degrees centigrade.

13. The method of claim 11, further comprising:
    compressing together the first and second micropads at a temperature in a range of approximately 250 to 270 degrees centigrade.

14. The method of claim 12, further comprising:
    forming a copper tin intermetallic compound.

15. A semiconductor process, comprising:
    forming a conductive layer, overlying at least a portion of a semiconductor substrate;
    forming a barrier layer overlying at least a portion of the conductive layer,
    wherein forming the barrier layer comprises using a bath comprising boron, cobalt, and tungsten for forming the barrier layer by electroless plating;
    performing electroless plating to form a copper layer overlying at least a portion of the barrier layer; and
    plating tin overlying at least a portion of the copper layer.

16. A semiconductor process as in claim 15, wherein a first micropad comprises a portion of the barrier layer, a portion of the copper layer, and a portion of the tin, the process further comprising:
    providing a wafer having a second micropad, wherein the second micropad comprises a copper portion; and compressing together the first and second micropads to form a copper tin intermetallic compound.

17. A semiconductor device, comprising:

a semiconductor substrate;

a conductive layer, overlying at least a portion of the semiconductor substrate; and a micropad, overlying at least a portion of the conductive layer, wherein the micropad comprises:

a barrier layer, overlying at least a portion of the conductive layer, wherein the barrier layer comprises cobalt, boron, and tungsten;

a copper layer, overlying the barrier layer; and tin layer, overlying the copper layer.

18. A semiconductor device as in claim 17, wherein the barrier layer comprises at least 75 percent cobalt.

* * * * *